United States Patent [19]

Ghiringelli et al.

[11] 4,268,887
[45] May 19, 1981

[54] PROTECTIVE SYSTEM FOR POWER STAGE OF IC AMPLIFIER

[75] Inventors: Giovanni Ghiringelli, Segrate; Bruno Murari, Monza, both of Italy

[73] Assignee: SGS-ATES Componenti Elettronici S.p.A., Milan, Italy

[21] Appl. No.: 25,539

[22] Filed: Mar. 30, 1979

Related U.S. Application Data

[63] Continuation-in-part of Ser. No. 862,355, Dec. 20, 1977, Pat. No. 4,157,513.

[30] Foreign Application Priority Data

Dec. 21, 1976 [IT] Italy .................. 30659 A/76

[51] Int. Cl.³ .................. H02H 5/04; H03F 3/04
[52] U.S. Cl. .................. 361/93; 330/143; 330/298; 330/207 P; 361/103
[58] Field of Search .................. 361/96–98, 361/103, 106, 93, 94; 323/9; 330/207 P, 289, 298, 143, 307

[56] References Cited

U.S. PATENT DOCUMENTS

| | | | |
|---|---|---|---|
| 3,258,606 | 6/1966 | Meadows | 330/289 X |
| 3,393,328 | 7/1968 | Meadows et al. | 330/289 X |
| 3,421,102 | 1/1969 | Andrews | 330/289 |
| 3,440,352 | 4/1969 | Boll | 330/289 X |
| 3,792,316 | 2/1974 | Bondini et al. | 323/9 X |
| 3,809,928 | 5/1974 | Evans | 330/143 X |
| 4,074,334 | 2/1978 | D'Arrigo et al. | 330/298 X |
| 4,157,513 | 6/1979 | Ghiringelli et al. | 361/96 X |

*Primary Examiner*—Patrick R. Salce
*Attorney, Agent, or Firm*—Karl F. Ross

[57] ABSTRACT

A power transistor in the final stage of an IC amplifier feeding a reactive load, such as a loudspeaker, has an emitter resistor connected across the input of a heat-sensitive monitoring transistor by way of a diode in bucking relationship with its base/emitter path, the monitoring transistor being part of a protective circuit which reduces the input signal to the power amplifier in the event of an overload. The monitoring transistor is separated from the power transistor, on the silicon chip of the amplifier, by a distance so chosen that an overload raising the temperature of the power amplifier will significantly reduce the operating threshold of the monitoring transistor only if the overload persists for a minimum period on the order of one millisecond. To minimize the dependency of the sensitivity of the protective circuit upon ambient temperature, the diode is also of heat-sensitive character and is positioned on the chip at a distance from the power transistor greater than that of the monitoring transistor so as to compensate in part for the lowering of its threshold in the case of longer-lasting temperature rises.

5 Claims, 7 Drawing Figures

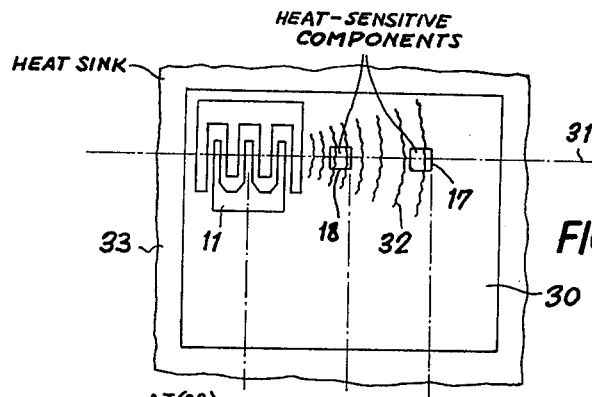
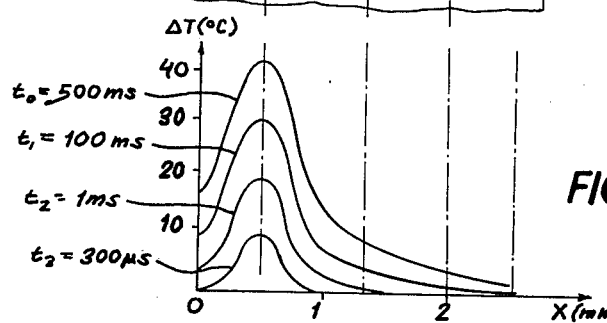
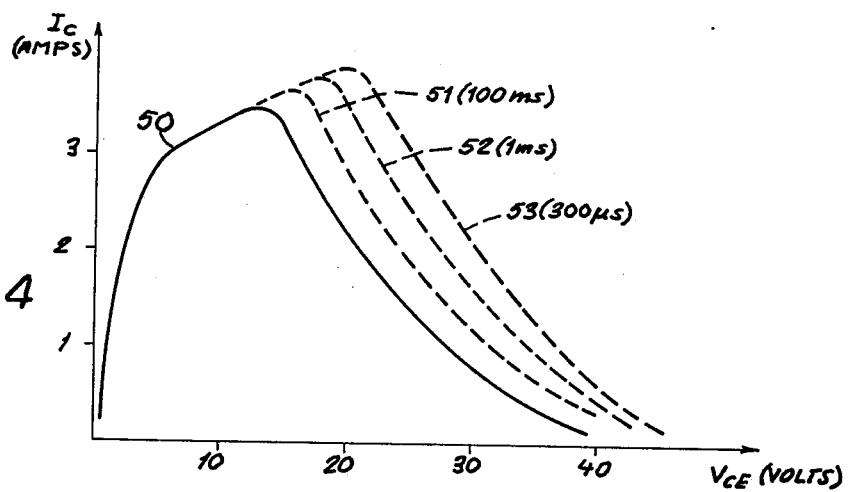
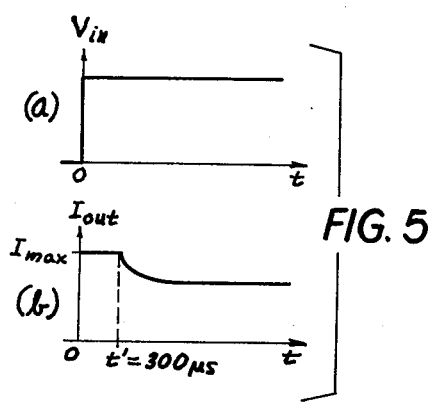

PROTECTIVE SYSTEM FOR POWER STAGE OF IC AMPLIFIER

CROSS-REFERENCE TO RELATED APPLICATION

This is a continuation-in-part of our copending application Ser. No. 862,355 filed Dec. 20, 1977, now U.S. Pat. No. 4,157,513.

FIELD OF THE INVENTION

Our present invention relates to a protective system for a power element, such as a final amplifier stage, forming part of a monolithic integrated circuit such as a silicon chip.

BACKGROUND OF THE INVENTION

In commonly owned U.S. Pat. Nos. 3,792,316 and 4,074,334 there has been disclosed and claimed a system of this type wherein a power transistor coacts with a protective circuit including a monitoring transistor connected across a resistance in an emitter lead of the power transistor. The collector/emitter path of the latter transistor is shunted by a voltage divider consisting of a resistor in series with a diode, the latter being connected in bucking relationship with the base/emitter path of the monitoring transistor. The monitoring transistor controls a switching transistor forming a bypass for signals fed to the power transistor whenever the collector current $I_c$ and the collector/emitter voltage $V_{CE}$ fall outside a predetermined safety area. This arrangement prevents the flow of excessive load currents (e.g. in the case of a short circuit) which could damage or destroy the final stage of the amplifier.

The response of such a protective circuit is virtually instantaneous. This, however, is not always desirable. With a purely or predominantly reactive load, e.g. a loudspeaker, the number of volt-amperes in the final stage may safely reach short-term values amounting to five or more times the maximum power that can be tolerated with purely resistive loads. On the other hand, a sharp reduction of the output current in the presence of a brief overload not only leads to signal distortions, which may involve the generation of jarring noises in audio transmission, but may also result in the emission of high-frequency transients interfering with electronic equipment close by.

In order to avoid these inconveniences, it has already been proposed to provide means in such integrated circuitry to retard the response of the protective device or system by a delay on the order of one millisecond, sufficient to outlast peak amplitudes which in the case of audio signals endure only for intervals on the order of tens of microseconds. Such conventional delay means may take the form of a supplemental condenser which, because of its high capacitance (on the order of tenths of microfarads), cannot be incorporated in the integrated circuit and thus constitutes a separate component, requiring additional terminal areas on the IC chip and associated binding posts on its container whereby both the costs and the dimensions of the unit are increased.

OBJECT OF THE INVENTION

The object of our present invention, therefore, is to provide improved protective means for a power element of an integrated-circuit chip responding with a predetermined delay to an overload condition without the need for extraneous circuit elements.

SUMMARY OF THE INVENTION

We realize this object, in conformity with our present invention, by providing the monitoring transistor of the normally inactive protective circuit, having input electrodes (e.g. base and emitter) connected across the aforementioned series resistor, with a temperature-dependent conduction threshold and disposing this transistor, together with the power element to be protected, on a semiconductive chip—juxtaposed with a heat sink—at a distance from that power element close enough to enable a significant lowering of its conduction threshold by a heat surge through the power element having a predetermined minimum duration, generally on the order of one millisecond.

If the protective circuit includes a bucking diode as described above, that diode could be thermally inert but, preferably, is also of the heat-sensitive type disclosed in our copending application and patent. Whereas, however, the diode according to our earlier disclosure played the part of a delay element positioned closer than the monitoring transistor to the power element so as to be struck first by the thermal wave emanating therefrom, we now propose to use that diode as a means for compensating in part the effect of the lowering of the conduction threshold of the monitoring transistor upon the current flow in the power element in the presence of a sustained rise in the temperature of the chip. This has the dual purpose of more closely conforming the operating characteristics of the protective circuit to the variations in the dynamic range of the system and preventing changes in ambient temperature from unduly affecting the conduction threshold.

BRIEF DESCRIPTION OF THE DRAWING

The above and other features of our invention will now be described in detail with reference to the accompanying drawing in which:

FIG. 3A is a more detailed diagram of part of the system of FIG. 1 modified in conformity with our present improvement;

FIG. 3B is a graph serving to explain the operation of our present system;

FIG. 4 is a current/voltage diagram for the final amplifier stage in a system of the type shown in FIG. 1;

FIG. 5 is a graphic representation of the input-voltage/output-current relationship in the case of a short circuit.

SPECIFIC DESCRIPTION

Figure 1:
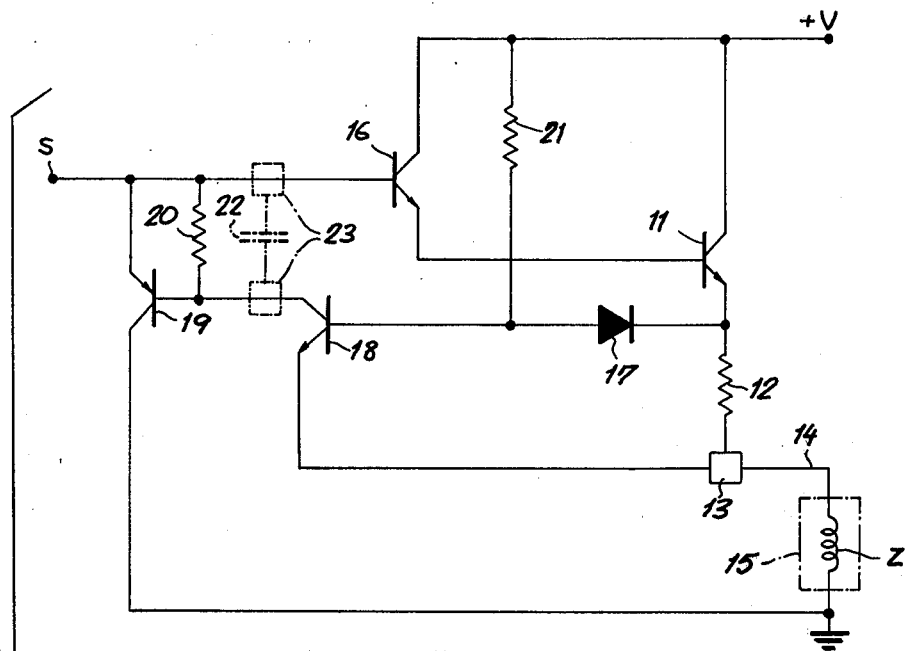
FIG. 1 is a circuit diagram of the final stage of an IC amplifier provided with a conventional delayed-response protective circuit.

In FIG. 1 we have shown the final stage of an integrated-circuit amplifier generally similar to those described in U.S. Pat. Nos. 3,792,316 and 4,074,334 referred to above.

The system shown in FIG. 1 comprises a power transistor 11 of NPN type driven in a Darlington configuration by an NPN pilot transistor 16, the collectors of the two transistors being tied to a source of positive potential $+V$. Power transistor 11 has its emitter connected through a low-ohmic resistor 12, which has a magnitude of several tens of milliohms and may be a metallized strip of the semiconductive substrate supporting the integrated circuitry, to a metallized junction 13 connected to an output terminal 14. Junction 13 and terminal 14 are grounded via a predominantly inductive load 15 comprising, for example, a loudspeaker coil Z.

A resistor 21 extends from terminal $+V$ to a junction between the anode of a diode 17 and the base of an NPN monitoring transistor 18 whose emitter is tied to junction 13 and whose collector is connected to the base of a PNP switching transistor 19 having a grounded collector and an emitter tied to a signal-input terminal S. The emitter and the base of transistor 19 are bridged by a biasing resistor 20. Terminal S is directly connected to the base of pilot transistor 16 and is energized through a nonillustrated input impedance so that conduction of the normally nonconductive switching transistor 19 reduces the signal energy available at pilot stage 16.

Figure 2:
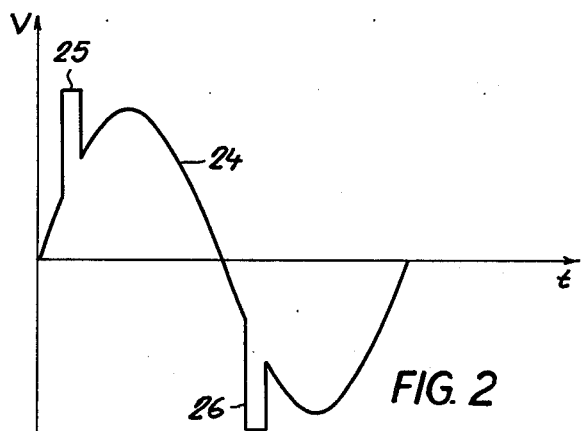
FIG. 2 is a graph showing the distortion of a signal in the system of FIG. 1.

The system of FIG. 1 operates essentially in the manner described in the above-identified prior patents, responding to a certain diminution of the current drawn through diode 17 and resistor 12 by conduction of monitoring transistor 18 in tandem with switching transistor 19 whereby the signal amplitude at the base of pilot transistor 16 is lowered; the point of conduction of transistor 19 depends on the magnitude of resistor 20. With a purely resistive load, an instantaneous response of this protective circuit will be satisfactory. With a purely or predominantly reactive load, however, a retardation of the response will be desirable for the reasons already indicated. In such a case it is conventional practice to connect a large external capacitor 22, as discussed above, across the biasing resistor 20 with the aid of additional metallized junctions 23 as indicated in phantom lines. Without such a capacitor, a sinusoidal voltage wave 24 illustrated in FIG. 2 with peaks surpassing the critical level would be subjected to distortion and would give rise to high-frequency transients. such as spikes 25, 26.

As already pointed out, the provision of the external capacitance 22 is cumbersome and expensive. Therefore, in accordance with our present invention, we utilize the temperature increase of power transistor 11 during an overload to modify the sensitivity of the protective circuit including transistors 18 and 19 as well as diode 17. This diode and the monitoring transistor 18 are heat-sensitive components and are disposed at different distances from power transistor 11 on a silicon chip 30 as illustrated in FIG. 3A. The Figure shows components 11, 17 and 18 arrayed on a straight line 31, yet this is not essential. Chip 30, serving as the semiconductive substrate, rests on a metallic heat sink 33 such as a copper block as is well known per se. The other constituents of the system, i.e. the remaining elements shown in full lines in FIG. 1 plus nonillustrated earlier amplifier stages, are preferably also incorporated in chip 30 but have not been depicted in FIG. 3A.

Even under steady-state conditions, the temperature of the silicon chip 30 is not uniform but is the highest around the middle of power transistor 11 constituting the principal heat source. This temperature distribution varies with the load current and depends on the thermal capacity of heat sink 33.

In FIG. 4, where the collector current $I_c$ of transistor 11 has been plotted against its collector/emitter voltage $V_{CE}$ sensed by voltage divider 21, 17, a curve 50 represents the safe limit of the dynamic range of the system for direct-current operation under short-circuit conditions whereas curves 51, 52 and 53 indicate corresponding limits for short-term overloads of progressively decreasing duration, specifically 100 ms, 1 ms and 300 $\mu$s, respectively. As will be apparent from these curves, higher voltages $V_{CE}$ and currents $I_c$ can be tolerated for such brief periods. These limiting values are determined by such parameters as operating frequency and load impedance.

In FIG. 3B we have plotted the temperature distribution along line 31 of chip 30 produced by a thermal wave 32, FIG. 3A, in the event of a heat surge of limited duration resulting from an overload of transistor 11. The curves $t_3$, $t_2$, $t_1$, $t_0$ represent temperature increments $\Delta T$ (in °C.), with respect to room temperature taken as a reference level, occurring at various points of distance x (in millimeters), measured from one of the chip edges, at respective instants occurring 0.3 ms, 1 ms, 100 ms and 500 ms after the incipient overload. These curves differ somewhat from those shown in the corresponding Figure of our copending application and patent since the measurements were made with different system parameters.

It will be noted that curve $t_3$, which represents an overload enduring for 300 $\mu$s, has a peak of slightly less than 10° C. and approaches zero ahead of the location of monitoring transistor 18 as seen in FIG. 3A. Thus, a current surge lasting for a fraction of a millisecond will not significantly affect the conduction threshold of this transistor which is normally biased to limit the dynamic range of the power transistor 11, in terms of volt-amperes, to the area bounded by the curve 53 of FIG. 4. Curve $t_2$ (FIG. 3B), peaking a little below 20° C., represents an overload lasting for 1 ms which is considered the critical minimum duration for the specific system here described by way of example; this curve goes to zero between the locations of transistor 18 and diode 17 so as to lower the conduction threshold of the transistor and shift the range limit to curve 52 of FIG. 4.

Curve $t_1$, whose peak approaches 30° C., represents an overload lasting for 100 ms and shows the propagation of thermal wave 32 (FIG. 3A) well beyond the location of diode 17, albeit in sharply attenuated form. Thus, after a delay corresponding to the transit time of the leading edge of the wave within chip 30 between components 18 and 17, diode 17 goes into action to counteract the effect of the progressive lowering of the threshold of transistor 18 by introducing a negative feedback into the system, owing to the reduction of the forward resistance of this diode which diminishes the voltage drop across the base/emitter path of transistor 18. The combined effect of the thermal modification of components 17 and 18 is a limitation of the dynamic range of power transistor 11 to the area bounded by curve 51 of FIG. 4.

A further lengthening of the overload, as illustrated by curve $t_0$ (FIG. 3B) which represents a duration of 500 ms, establishes the curve 50 of FIG. 4 as the range limit. This duration may be considered a steady state tantamount to the flow of an elevated direct current for an indefinite period. Thus, no significant further shift in the range limit occurs with overloads lasting for more than half a second.

In FIG. 5 we have shown in graph (a) a steeply rising input voltage $V_{in}$ while graph (b) gives the corresponding output current $I_{out}$ for a short-circuited load. As will be apparent from the latter graph, the output current remains at an initial level $I_{max}$ for an interval $t'=300$ $\mu$s and then gradually decreases to a lower level as the protective circuit progressively shifts the boundary of the dynamic range from curve 53 (FIG. 4) to curve 50.

Figure 6:
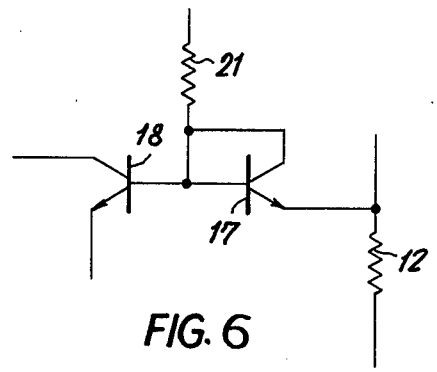
FIG. 6 shows a structural detail of the assembly diagrammatically represented in FIG. 3A.

FIG. 6 shows diode 17 as an NPN transistor with short-circuited collector and base tied to the base of monitoring transistor 18. This constitutes a well-known current-mirror circuit and ensures that, with the use of transistors of similar characteristics, their exposure to a given temperature rise will have substantially equal and opposite effects upon the protective system.

We claim:

1. In integrated circuitry comprising a power element connected across a load by way of a series resistor, and a normally inactive protective circuit including a monitoring transistor with input electrodes connected across said series resistor for limiting the current flow in said power element in response to a voltage drop across said series resistor exceeding a normal value by which said monitoring transistor is biased to cutoff, the improvement wherein said monitoring transistor has a temperature-dependent conduction threshold and is disposed together with said power element on a semiconductor chip, juxtaposed with a heat sink, at a distance from said power element close enough to enable a significant lowering of said conduction threshold by a heat surge through said power element having a minimum duration on the order of one millisecond.

2. The improvement defined in claim 1 wherein said input electrodes are a base and an emitter, said protective circuit further including a heat-sensitive diode connected in bucking relationship with the base/emitter path of said monitoring transistor, said diode being disposed on said semiconductor chip at a distance from said power element greater than that of said monitoring transistor for partly compensating the effect of the lowering of said conduction threshold upon said current flow in the presence of a sustained rise in the temperature of said semiconductor chip.

3. The improvement defined in claim 2 wherein said diode is a transistor with a base connected to its own collector and to the base of said monitoring transistor to form a current-mirror connection therewith.

4. The improvement defined in claim 2 wherein said power element, said diode and said monitoring transistor are disposed substantially in a straight line on said semiconductor chip.

5. In integrated circuitry comprising a power element connected across a load by way of a series resistor, and a normally inactive protective circuit including a monitoring transistor with a base and an emitter connected across said series resistor for limiting the current flow in said power element in response to a voltage drop across said series resistor exceeding a normal value by which said monitoring transistor is biased to cutoff, the improvement wherein said monitoring transistor has a temperature-dependent conduction threshold and is disposed together with said power element on a semiconductor chip, juxtaposed with a heat sink, at a distance from said power element close enough to enable a significant lowering of said conduction threshold by a heat surge through said power element having a predetermined minimum duration, said protective circuit further including a heat-sensitive diode connected in bucking relationship with the base/emitter path of said monitoring transistor, said diode being disposed on said semiconductor chip at a distance from said power element greater than that of said monitoring transistor for partly compensating the effect of the lowering of said conduction threshold upon said current flow in the presence of a sustained rise in the temperature of said semiconductor chip.

* * * * *